US012763284B2

(12) United States Patent
Petry et al.

(10) Patent No.: US 12,763,284 B2
(45) Date of Patent: Oct. 13, 2026

(54) MULTIMODE DOSE COMPENSATION SYSTEM

(71) Applicant: Applied Materials, Inc., Santa Clara, CA (US)

(72) Inventors: Klaus Petry, Merrimac, MA (US); Jacob William Mullin, North Andover, MA (US); Yan Ma, Acton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 18/397,885

(22) Filed: Dec. 27, 2023

(65) Prior Publication Data

US 2025/0218722 A1 Jul. 3, 2025

(51) Int. Cl.
*H01J 37/304* (2006.01)
*H01J 37/317* (2006.01)

(52) U.S. Cl.
CPC ........ *H01J 37/304* (2013.01); *H01J 37/3171* (2013.01); *H01J 2237/0473* (2013.01); *H01J 2237/0475* (2013.01); *H01J 2237/057* (2013.01); *H01J 2237/24564* (2013.01)

(58) Field of Classification Search
CPC ............... H01J 37/20; H01J 2237/0475; H01J 2237/31701
See application file for complete search history.

(56) References Cited

U.S. PATENT DOCUMENTS 4,929,840 A * 5/1990 Dykstra .............. H01J 37/3171 250/397
4,980,562 A 12/1990 Berrian
5,641,969 A 6/1997 Cooke
(Continued)

FOREIGN PATENT DOCUMENTS

GB 2307592 A 5/1997
JP H10134760 A 5/1998
(Continued)

OTHER PUBLICATIONS

International Search Report and Written Opinion for International Application No. PCT/US2024/057449, mailed on Mar. 24, 2025, 8 pages.

*Primary Examiner* — Wyatt A Stoffa
*Assistant Examiner* — Jing Wang
(74) *Attorney, Agent, or Firm* — KDW Firm PLLC

(57) ABSTRACT

A method, a system and computer program product for controlling exposure of a substrate positioned on a platen in an ion implantation system to an ion beam. A first current value determined based on a powering potential powering an ion source is received. A second current value determined based on an accelerating potential or a decelerating potential supplied to the ion implantation apparatus and affecting generation of the ion beam by the ion source for application to a substrate positioned on a platen is received. One or more energy filter supply current values are determined based on one or more energy filter supply potentials supplied to an energy filter positioned in the path of the ion beam. Platen position values are generated based on the first and second current values and energy filter supply current values. A position of the platen is adjusted using platen position values.

18 Claims, 7 Drawing Sheets

(56) References Cited

U.S. PATENT DOCUMENTS

| | | | | |
|---|---|---|---|---|
| 6,130,436 | A * | 10/2000 | Renau | H01J 37/3171 250/281 |
| 6,313,474 | B1 | 11/2001 | Iwasawa | |
| 6,657,209 | B2 | 12/2003 | Halling | |
| 6,965,116 | B1 | 11/2005 | Wagner | |
| 6,998,625 | B1 * | 2/2006 | McKenna | H01J 37/3171 250/492.2 |
| 7,361,892 | B2 * | 4/2008 | Kabasawa | H01J 37/3171 250/290 |
| 7,528,391 | B2 | 5/2009 | Low | |
| 7,557,363 | B2 | 7/2009 | Huang | |
| 9,978,556 | B2 * | 5/2018 | Lee | H01J 37/08 |
| 10,002,751 | B2 * | 6/2018 | Takahashi | H01J 37/05 |
| 11,264,205 | B2 | 3/2022 | Wilson | |
| 11,646,175 | B2 | 5/2023 | DeLuca | |
| 2001/0042836 | A1 * | 11/2001 | Olson | H01J 27/022 250/424 |
| 2005/0269526 | A1 * | 12/2005 | Rathmell | H01J 37/05 250/492.21 |
| 2008/0073584 | A1 | 3/2008 | Callahan | |
| 2009/0236547 | A1 * | 9/2009 | Huang | H01J 37/3171 250/492.21 |
| 2013/0295753 | A1 | 11/2013 | Hwang | |
| 2015/0200073 | A1 | 7/2015 | Jen | |
| 2017/0110286 | A1 * | 4/2017 | Chang | H01J 37/3002 |
| 2017/0221678 | A1 * | 8/2017 | Likhanskii | H01J 37/3007 |
| 2019/0051488 | A1 | 2/2019 | Schustereder | |
| 2021/0020399 | A1 * | 1/2021 | Likhanskii | H01J 37/12 |
| 2022/0285126 | A1 * | 9/2022 | Tsukihara | H01J 37/3007 |

FOREIGN PATENT DOCUMENTS

| | | | |
|---|---|---|---|
| JP | 2014099284 | A | 5/2014 |
| KR | 20110015523 | A | 2/2011 |
| KR | 1020230006400 | A | 1/2023 |
| WO | 2014179674 | A1 | 11/2014 |
| WO | 2021113099 | A1 | 6/2021 |

* cited by examiner

MULTIMODE DOSE COMPENSATION SYSTEM

TECHNICAL FIELD

This disclosure relates generally to substrate processing, and in particular, to controlling exposure of the substrate positioned on a platen in an ion implantation system to an ion beam.

BACKGROUND

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a particular doping profile, one or more dopants may be implanted in the form of ions in various doses and various energy levels. Ion implantation systems, which are used for such implantations, typically include an ion source and a series of beamline components. The ion source includes a chamber for generating of ions, a power source and an extraction electrode assembly disposed near the chamber ion source. The beamline components, may include, for example, a mass analyzer, a first acceleration or deceleration stage, a collimator, and a second acceleration or deceleration stage. Much like a series of optical lenses for manipulating a light beam, the beamline components can filter, focus, and manipulate ions or ion beam having particular species, shape, energy, and/or other qualities. The ion beam passes through the beamline components and may be directed toward a substrate mounted on a platen or clamp. The substrate may be moved in one or more dimensions (e.g., translated, rotated, and tilted). However, current designs of existing ion implantation systems suffer from non-uniform applications of ion beams to substrates as a result of photoresist outgassing conditions created in the substrate processing chamber, resulting in lower-quality semiconductor products, longer processing times, and substantially higher manufacturing costs.

SUMMARY

In some implementations, the current subject matter relates to an ion implantation apparatus. The apparatus may include an ion source configured to generate an ion beam directed at a substrate positioned on a platen, a first power supply source configured to generate a powering potential to power the ion source, and one or more second power supply sources configured to generate an accelerating potential or a decelerating potential. The accelerating potential or the decelerating potential may be configured to affect generation of the ion beam by the ion source for application to the substrate. The apparatus may further include an energy filter positioned in a path of the ion beam between the ion source and the substrate. The ion implantation apparatus may also include a dose compensation controller that may be configured to perform one or more of the following operations. The dose compensation controller may determine a first current value based on a powering potential powering the ion source. It may also determine a second current value based on the accelerating potential or the decelerating potential. The dose compensation controller may further determine one or more energy filter supply current values based on one or more energy filter supply potentials supplied to the energy filter. It may generate, based on the first and second current values and one or more energy filter supply current values, one or more platen position values. The dose compensation controller may cause adjustment of a position of the platen in the path of the ion beam using the generated platen position values.

In some implementations, the current subject matter includes one or more of the following optional features. The accelerating potential may be configured to increase an energy of the ion beam. The decelerating potential may be configured to decrease an energy of the ion beam.

In some implementations, application of the decelerating potential may be disabled while application of the accelerating potential is enabled. Application of the accelerating potential may be disabled while application of the decelerating potential is enabled.

In some implementations, the energy filter may include one or more electrodes configured to affect one or more parameters of the ion beam passing through the energy filter. One or more parameters may include at least one of the following: a direction of the ion beam, an energy of the ion beam, a focus of the ion beam, a trajectory of the ion beam, and any combination thereof.

In some implementations, one or more platen position values may be determined based on a difference between a sum of the first and second current values and one or more energy filter supply current values. Adjusting of the position of the platen based on one or more platen position values may cause the ion beam to apply to a predetermined location on the substrate. The dose compensation controller may include a filter current measurement component that may adjust one or more electrode parameters associated with one or more electrodes in the energy filter. One or more electrode parameters may include at least one of the following: one or more current values determined based on one or more potentials supplied to one or more electrodes, one or more position values associated with one or more positions of one or more electrodes in the energy filter, and any combination thereof.

In some implementations, the current subject matter relates to an ion implantation system that may include an ion source configured to generate an ion beams directed at a substrate positioned on a platen, and a first power supply source configured to generate a powering potential to power the ion source, where a first current value is determined based on the powering potential. The system may also include one or more second power supply sources configured to generate an accelerating potential or a decelerating potential. The accelerating potential or the decelerating potential may be configured to affect generation of the ion beam by the ion source for application to the substrate, where a second current value may be determined based on the accelerating potential or the decelerating potential. The system may further include an energy filter positioned in a path of the ion beam between the ion source and the substrate. The system may further include at least one processor, and at least one non-transitory storage media storing instructions, that when executed by the at least one processor, may cause the processor to: determine one or more energy filter supply current values based on one or more energy filter supply potentials supplied to the energy filter, generate, based on the first and second current values and one or more energy filter supply current values, one or more platen position values, and cause adjustment of a position of the platen in the path of the ion beam using one or more platen position values. In some implementations, the ion implantation system may include one or more of the above-referenced optional features.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. The drawings are schematic in nature and do not represent actual dimensions or aspect ratios. In the drawings.

DETAILED DESCRIPTION

Figure 1:
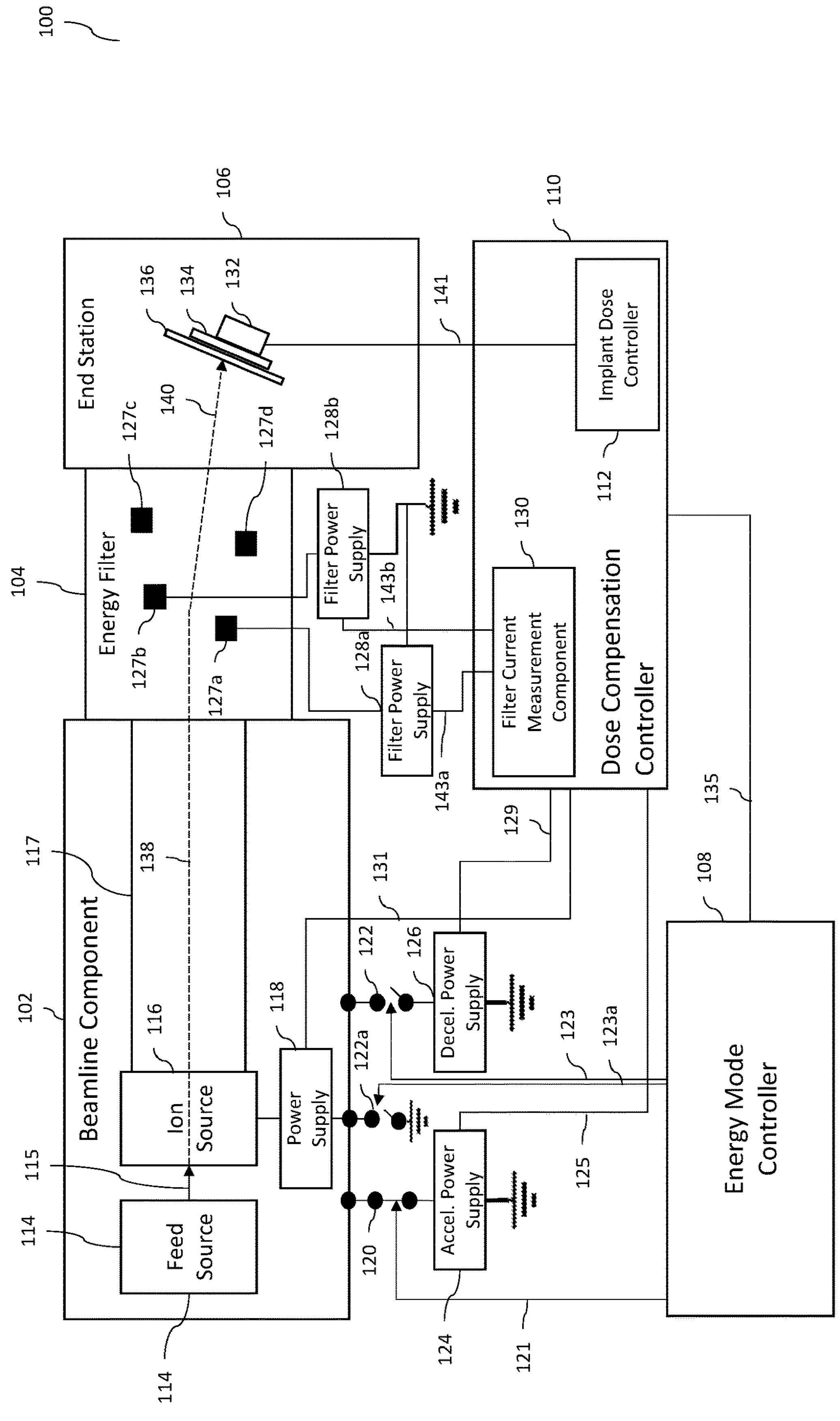
FIG. 1 illustrates an example ion implantation system, according to some implementations of the current subject matter.

To address these and potentially other deficiencies of currently available solutions, one or more implementations of the current subject matter relate to methods, systems, articles of manufacture, and the like that can, among other possible advantages, provide an ability to perform substrate processing, and in particular, to controlling exposure of a substrate positioned on a platen in an ion implantation system to an ion beam through changes in position of the platen.

In some implementations, the current subject matter relates to an ion implantation system. The system may include an ion source configured to generate an ion beam directed at a substrate positioned on a platen. The ion source may be powered by an extraction power supply. One or more additional voltage sources may be configured to generate an accelerating potential/voltage and/or a decelerating potential/voltage. For example, an accelerating power supply or voltage source may generate the accelerating potential and a decelerating power supply or voltage source may generate the decelerating potential. Alternatively, or in addition, the same voltage source may generate both types of potentials. Moreover, the same voltage source may also generate potentials to power the ion source as well as the accelerating/decelerating sources. The setting value(s) of accelerating and/or decelerating power supplies may be different from the setting value(s) of the voltage source powering the ion source. The accelerating/decelerating potential(s) may be configured to affect generation of ion beam by the ion source for application to the substrate. Further, the accelerating potential may be configured to increase an energy of the ion beam being directed at the substrate. Conversely, the decelerating potential may be configured to decrease an energy of ion beam being directed at the substrate. Additionally, in some example implementations, enabling of application of the accelerating potential(s) may disable application of the decelerating potential(s) and vice versa. Further, in some example implementations, application of decelerating potential(s) may also couple the power supply for generating the ion beam to ground and/or disable it.

The ion implantation system may also include an energy filter that may be positioned in the path of ion beam between the ion source and the substrate. The energy filter may include one or more electrodes that may be configured to affect one or more parameters of ion beam that may be passing through the energy filter. The parameters may include at least one of the following: a direction of the ion beam, an energy of the ion beam, a focus of the ion beam, a trajectory of the ion beam, and/or any other parameters, and/or any combination thereof.

Further, the ion implantation system may include one or more processors that may be configured to control movement (e.g., velocity), positioning and/or orientation of the platen (and hence, the substrate positioned on the platen) in the path of the ion beam. In particular, the processor(s) may determine current values of energy filter supply currents that may be supplied to the energy filter (e.g., using one or more electrodes disposed in the energy filter). Using the energy filter supply current values as well as current values of powering current(s) and accelerating/decelerating current (s), the processor(s) may be configured to determine one or more platen velocity, position and/or orientation values (hereinafter referred to as platen position values). Using the platen position values, the processor(s) may generate one or more instructions that may cause adjustment of a position of the platen in the path of the ion beam. It should be noted that the platen may be coupled to one or more motorized mechanisms that may be configured to receive instructions from the processor(s) and, using these instructions, adjust position and/or orientation of the platen with respect to and/or in the path of the ion beam directed at the platen (and hence, the substrate). Adjustment of the position/orientation of the platen may involve translation (in any direction), rotation (in any direction), and/or any other movement of the platen, and, hence, the substrate that may be placed on the platen.

Adjustment of the position of the platen based on the platen position value(s) may cause the ion beam to apply to a predetermined location on the substrate. For example, prior to adjustment of the position of the platen, the ion beam may have been applied to a first section of the substrate, whereas, after adjustment, the ion beam may be applied to another section of the substrate. In some implementations, position adjustments, and hence, application of the ion beam, may be continuous, e.g., without beam interruption during position changes, and/or interval-based, e.g., one section of substrate exposed to the ion beam at a time during one interval.

In some example implementations, the processor(s) may generate one or more instructions to trigger adjustment of one or more electrode parameters associated with one or more electrodes of the energy filter based on the determined current values. Adjustment of the electrode parameters may cause a change in how the ion beam is applied to the substrate. The electrode parameters may include at least one of the following: one or more current values of one or more currents supplied to the electrode(s), one or more position values associated with one or more positions of the electrode (s) in the energy filter, and any combination thereof. Adjustments of electrode(s) may be executed separately (or not at all) and/or simultaneously with the adjustments of the position(s) of the platen.

It should be noted that, as used herein, the terms “on,” “overlying,” “disposed on” and/or “over” may be used to indicate that two or more elements may be in direct physical contact with each other and/or are not in direct contact with each other. For example, “over” may mean that one element may be positioned above another element but not contact each other, and may have another element and/or elements positioned between these two elements. As such, the terms “on,” “overlying,” “disposed on” and “over” may be used interchangeably herewith.

FIG. 1 illustrates an example ion implantation system 100, according to some implementations of the current subject matter. The system 100 may include a beamline component 102, an energy filter 104, a processing chamber or an end station 106, an energy mode controller 108, a dose compensation controller 110 that may include an implant dose controller 112 and a filter current measurement component 130, an accelerating power supply 124 coupled to the beamline component 102 using a switch 120 (and to a ground), a decelerating power supply 126 coupled to the beamline component 102 using a switch 122 (and to a ground), and one or more filter power supplies 128 (a, b) (which may also be coupled to a ground).

The beamline component 102 may include a feed source 114, an ion source 116, an ion source power supply 118. The ion source 116 of the beamline component 102 may be configured to produce an ion beam 138 that may be passed through the energy filter 104. The energy filter 104 may be configured to alter direction of the generated ion beam 138 to produce ion beam 140 that may be applied to a substrate 136 positioned on a platen 134 in the end station 106. The beamline component 102 may also include an ion implanter and one or more beamline components 117.

The ion source 116 may include a chamber for receiving a flow of gas 115 from the feed source 114 and generate ions. The ion source 116 may also include the ion source power supply 118 and one or more extraction electrodes disposed near the chamber. The beamline components 117 may include, for example, a mass analyzer, a first acceleration and/or deceleration stage, a collimator, and/or any other beamline components. For example, the energy filter (also referred to as an energy purity module (EPM) or an energy filter) 104 may be incorporated into the beamline components 117 and/or may be a separate component, as shown in FIG. 1.

The beamline components 117 may filter, focus, and/or manipulate ions and/or the ion beam 138 to have a particular species, shape, energy, and/or other qualities. The ion beam 138 may pass through the beamline components 117 and may be directed toward the substrate 136 mounted on the platen 134 and/or clamp within the end station 106. The substrate 136 may be moved in one or more dimensions (e.g., translate, rotate, and tilt) using one or more platen adjustment mechanisms 132 that may be coupled to the platen 134.

As shown in FIG. 1, the system 100 may include one or more feed sources 114 operable with the chamber of the ion source 116. In some implementations, material provided from the feed source 116 may include source material and/or any other additional material. The source material may include one or more dopant species that may be introduced into the substrate 136 in the form of ions. The additional material may include diluent that may be introduced into the ion source chamber of the ion source 116 along with the source material to dilute the concentration of the source material in the chamber of the ion source 116. The additional material may also include a cleaning agent (e.g., an etchant gas, etc.) introduced into the chamber of the ion source 116 and transported within the system 100 to clean one or more of the beamline components 117.

In some implementations, different species may be used as the source and/or the additional material. Non-limiting examples of the source and/or additional materials may include at least one of the following: atomic and/or molecular species that may include boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), chlorine (Cl), and/or nay other elements. As can be understood, the above listed species are non-limiting, and other atomic and/or molecular species may be used. Depending on the application(s), the species may be used as the dopants and/or the additional material. For instance, one species may be used as a dopant in one application and may be used as an additional material in another application, and/or vice-versa.

In some implementations, the source and/or additional material may be provided into the ion source chamber of the ion source 116 in gaseous and/or vapor form. If the source and/or additional material is in non-gaseous and/or non-vapor form, a vaporizer (not shown in FIG. 1) may be provided near the feed source 114 to convert the material into gaseous and/or vapor form. To control an amount and a rate the source and/or the additional material is provided into the system 100, a flowrate controller may be provided. The flowrate controller may be incorporated into the ion source power supply 118 and/or may be a separate processing component.

The energy filter 104 may include one or more electrodes 127 (a, b, c, d) that may be positioned proximate to the path of the ion beam 138 to affect and/or control deflection, deceleration, and/or focus of the ion beam 138. In some example, non-limiting implementations, the energy filter 104 may be a vertical electrostatic energy filter (VEEF) and/or any other electrostatic filter (EF). Alternatively, or in addition, the energy filter 104 may be an electrostatic lens of a dual magnet ribbon beam high current ion implanter.

The electrodes 127 may be coupled to one or more filter power supplies 128. For example, as shown in FIG. 1, electrode 127*a* may be coupled to the filter power supply 128*a*; electrode 127*b* may be coupled to the filter power supply 128*b*; etc. (for ease of illustration only two filter power supplies are shown in FIG. 1). In some implementations, each electrode 127 may have its power filter power supply 128. Alternatively, or in addition, one or more electrodes 127 may share one or more filter power supplies 128.

In some implementations, the electrodes 127 may include a set of upper electrodes (e.g., electrodes 127*b* and 127*c*) disposed above the ion beam 138 and a set of lower electrodes (e.g., electrodes 127*a* and 127*d*) disposed below the ion beam 138. The set of upper electrodes and the set of lower electrodes may be stationary and/or have fixed positions. Alternatively, or in addition, positions of one or more of the electrode 127 may be adjustable (e.g., through translation, rotation, tilting, etc.). A difference in potentials between the set of upper electrodes and the set of lower electrodes may also be varied along the ion beam trajectory to reflect an energy of the ion beam at various point along the ion beam trajectory for independently controlling deflection, deceleration, focus, and/or any other parameters of the ion beam 138.

In operation, some of the ions traversing through the energy filter 104 may exchange charge with background neutrals. These may be neutrals of the residual gas in the tool, for example, nitrogen and water, and/or neutral products evolving off a substrate during ion implantation. These products may be varied in composition, and thus, may allow for complicated chemical interactions. During the charge exchange process, the formerly neutral atoms may become charged and/or accelerate toward the negatively biased electrodes 127 in the energy filter 104.

As shown in FIG. 1, the energy mode controller 108 may be communicatively coupled, via a connection 135, to the dose compensation controller 110 and may be configured to exchange one or more instructions with controller 110. The energy mode controller 108 may also be configured to control modes of operation of the system 100 via the switches 120 and 122 (e.g., opening and/or closing thereof), via connections 121, 123, respectively, where switch 120 may communicatively couple the accelerating power supply 124 to the beamline component 102 and the switch 122 may communicatively couple the decelerating power supply 126 to the beamline component 102. In addition to being coupled to the beamline component 102, the power supplies 124 and 126 may be communicatively coupled to the dose compensation controller 110 using connections 125, 129, respectively, and may be configured to exchange one or more instructions with controller 110 using such connections. Similarly, the ion source power supply 118 of the beamline component 102 may be communicatively coupled, via the connection 131, to the dose compensation controller 110 and may be configured to exchange one or more instructions with the dose compensation controller 110 using this connection. In some implementations, the energy mode controller 108 may also be configured to control power supply 118 of the beamline component 102, via, for instance, a separate switch (not shown in FIG. 1) and/or in any other manner. In some implementations, the ion source power supply 118 may also be controlled by the energy mode controller 108 via connection 123*a* and switch 122*a*. For example, the energy mode controller 108 may be configured to open switch 122*a* by sending an appropriate instruction via connection 123*a* so that the ion source power supply 118 may provide power to the ion source 116 for generating the ion beam 138. The switch 122*a* may be closed by the energy mode controller 108 via the connection 123*a*, thereby connecting the ion source power supply 118 to ground when, for example, application of power from the ion source power supply 118 is no longer desired. The energy mode controller 108 may cause coupling of the ion source power supply 118 to the ion source 116 so that operation of the system 100 may commence.

The dose compensation controller 110 may be communicatively coupled, via connections 143 (*a, b*) to the filter power supplies 128 (*a, b*), respectively. In some implementations, the connections 143 (*a, b*) may couple the filter current measurement component 130 of the dose compensation controller 110 to the respective filter power supplies 128 (*a, b*). The filter power supplies 128 may be communicatively coupled (which may include electrical coupling and/or connection and/or any other type of coupling and/or connection) to the electrodes 127 of the energy filter 104 and may supply current and/or voltage signals to one or more electrodes 127 (as discussed herein), which may affect one or more properties of the ion beam 138 (e.g., to form ion beam 140). The filter current measurement component 130 may exchange one or more instructions with the filter power supplies 128 using respective connections 143.

The dose compensation controller 110 may also include the implant dose controller 112 that may exchange one or more signals/connections, via a connection 141, with one or more platen adjustment mechanisms 132 positioned in the end station 106 to cause adjustment of orientation of the platen 134 (and hence, application of the ion beam 140 to the substrate 136).

As stated above, the energy mode controller 108 may control operation modes of the system 100, which may include an accelerating mode, a decelerating mode, or none of the above (i.e., no accelerating or decelerating potentials being supplied to the beamline component 102). In the accelerating mode, the accelerating power supply 124 may provide accelerating potential to the beamline component 102 and, in the decelerating mode, the decelerating power supply 126 may provide decelerating potential to the beamline component 102. Further, in the accelerating mode, the ion source power supply 118 may also be configured to provide power to the ion source 116 (i.e., by opening switch 122*a*), whereas in the decelerating mode, the ion source power supply 118 may be connected to the ground (i.e., by closing switch 122*a*). The potentials may affect generation and/or one or more properties of the ion beam 138. In some example implementations, the accelerating and/or decelerating potentials may be supplied via the ion source power supply 118 (through, for example, a series connection of power supplies 118 and 124 for accelerating potential or 126 for decelerating potential) to the ion source 116.

The energy mode controller 108 may control coupling of the power supplies 124 and 126 using respective switches 120, 122, i.e., the accelerating power supply 124 may be communicatively coupled to the beamline component 102 via switch 120 and the decelerating power supply 126 may be communicatively coupled to the beamline component 102 via switch 122. To control the switches 120, 122, the energy mode controller 108 may send instruction(s)/signal(s) (e.g., an electrical current, a voltage, etc.) to open and/or close the switches via connections 121, 123, respectively. For instance, to supply accelerating potential from the accelerating power supply 124, the energy mode controller 108 may send instruction(s)/signal(s), via connection 121, to close the switch 120, thereby coupling the accelerating power supply 124 to the beamline component 102, and may send another instruction(s)/signal(s), via line 123, to open the switch 122, thereby uncoupling the decelerating power supply 126 from the beamline component 102. Alternatively, or in addition, the normal state of operation of one or both switches 120 and 122 may be an open state, whereby both switches may be uncoupled from the beamline component 102. As can be understood, any arrangement of coupling of the accelerating/decelerating power supplies 124, 126 to the beamline component 102 is possible. In some implementations, the energy mode controller 108 may also control a potential/voltage level supplied to the beamline component 102 by one or both accelerating/decelerating power supplies 124, 126. The amount of supplied potential (accelerating potential and/or decelerating potential) may be determined based on a specific application and/or desired results.

Upon triggering supply of accelerating or decelerating potential from respective power supplies 124, 126, the power supplies may be configured to send data/information associated with the values of currents (e.g., $I_{ACC}$ (accelerating current value) or $I_{DEC}$ (decelerating current value)) that are being determined based on the respective potentials supplied to the beamline component 102 to the dose compensation controller 110. In addition to the value(s) of accelerating/decelerating currents, the ion source power supply 118 may also send data/information related to the value of current ($I_{EXT}$), which is determined based on the potential supplied to the ion source 116, to the dose compensation controller 110. The above current values, along with current value(s) ($I_{FILT}$) of current(s) determined based on the potentials supplied by filter power supplies 128 to electrode(s) 127, may be used by the dose compensation controller 110 to determine one or more end station 106 currents ($I_{ES}$) either in acceleration or deceleration mode, scanning velocities ($V_1$ which may be continuously updated) of the platen 134, and/or one or more positions (e.g., $P_{platen}$) of the platen 134 in the end station 106 in the path of the ion beam 140. The dose compensation controller 110, and, in particular, its filter current measurement component 130, may receive data/information related to the $I_{FILT}$ current values from the filter power supplies 128 via respective connections 143.

For example, the end station current applied to the substrate 136 in the deceleration mode may be determined using the following equation:

$$I_{ES} = I_{EXT} - I_{DEC} \tag{1}$$

End station current in the acceleration mode without any dose compensation applied to the substrate 136 may be determined using the following:

$$I_{ES} = I_{ACC} \tag{2}$$

However, end station current in the acceleration mode with dose compensation, as determined by the dose compensation controller 110 may be determined as follows:

$$I_{ES} = I_{ACC} - \sum I_{FILT} \tag{3}$$

Additionally, a scan velocity of the platen 134 (e.g., movement velocity of the platen 134 as driven by the platen adjustment mechanisms 132 based on instructions from the implant dose controller 112) with dose compensation may be determined using:

$$V_1 = V_0 + V_0 * K * (I_{ES1}/I_{ES0} - 1) \tag{4}$$

where K is a dose compensation factor that may be determined by the dose compensation controller 110; $I_{ES0}$ is an initial end station current applied to the substrate 136; and $I_{ES1}$ is one or more subsequent (e.g., continuously determined) end station current received during dose compensation, where end station currents ($I_{ES0}$ and/or $I_{ES1}$) may be determined in any desired way.

Alternatively, or in addition, the dose compensation controller 110 may determine platen position value(s) ($P_{platen}$) based on a difference between a sum of the current values of the ion source powering current(s) and accelerating/decelerating current(s), and the energy filter supply current value(s):

$$P_{platen} = f((I_{EXT} + I_{ACC\ or\ DEC}) - I_{FILT}) \tag{5}$$

where $P_{platen}$ is a position value of the platen in the end station 106; $I_{ACC\ or\ DEC}$ is/are current value(s) associated with the accelerating or decelerating currents, respectively.

In some example implementations, the dose compensation controller 110 may also use the above current values to determine currents supplied to one or more electrodes 127 by the filter power supplies 128. For example, using the current values obtained from one or more power supplies 118, 124, 126, the dose compensation controller 110 may determine that voltage(s) on electrode 127*a* may need to be decreased and voltage(s) on electrode 127*b* may need to be increased. Once such determination is made, the dose compensation controller 110 may send appropriate instructions to the filter power suppl(ies) 128 via the filter current measurement component 130. As can be understood, any other determinations of current(s) and/or voltage(s) may be possible.

The dose compensation controller 110 may automatically receive data/information related to power signals (e.g., current(s), voltage(s)) provided by the power supplies 118, 124, and/or 126. Alternatively, or in addition, the dose compensation controller 110 may request this data/information from one or more of the power supplies 118, 124, and/or 126 upon receiving an indication, via connection 135, from the energy mode controller 108 that a particular mode (e.g., accelerating or decelerating) was initiated. The dose compensation controller 110 may also independently obtain this data/information from the power supplies 118, 124, and/or 126 without receiving any indication from the energy mode controller 108.

In some implementations, the energy mode controller 108 may be configured to initiate a dose compensation process by sending one or more instructions to the dose compensation controller 110, via connection 135. These instructions may be sent simultaneously with and/or separately from the instructions to the switches 120 and/or 122. Moreover, sending one instruction (e.g., an instruction to close switch

120 via connection 121) may trigger a sequence of sending instructions to and/or by other components of the system 100 (e.g., an instruction to controller 110 via connection 135). As can be understood, any way of sending instructions to one or more components of the system 100 is possible.

The dose compensation process may be used to determine a particular velocity, position and/or orientation of the platen 134 (and hence, the substrate 136) in the end station 106 in the path of the ion beam 140. Such determination may be beneficial in ensuring uniform application of the ion beam 140 to the substrate 136 (in accordance with preprogrammed specifications). Moreover, the dose compensation process may also be beneficial in reducing photoresist outgassing effects that may occur when electrons resulting from a charge exchange travel towards the beamline component and are returned to ground through the power supply, which, in turn, makes ion implant beam current signals inaccurate, thereby resulting in non-uniform application of the ion beam to the substrate.

In some implementations, once the dose compensation process is triggered, the dose compensation controller 110 may be configured to initiate collection of data/information related to current value(s) determined based on potential(s) supplied by power supplies 124 or 126 (depending on whether accelerating or decelerating modes are triggered by the energy mode controller 108) as well as the power supply 118. As stated herein, the current values may be provided automatically to the dose compensation controller 110 and/or requested by the dose compensation controller 110 from the power supplies 118, 124, and/or 126.

Figure 4:
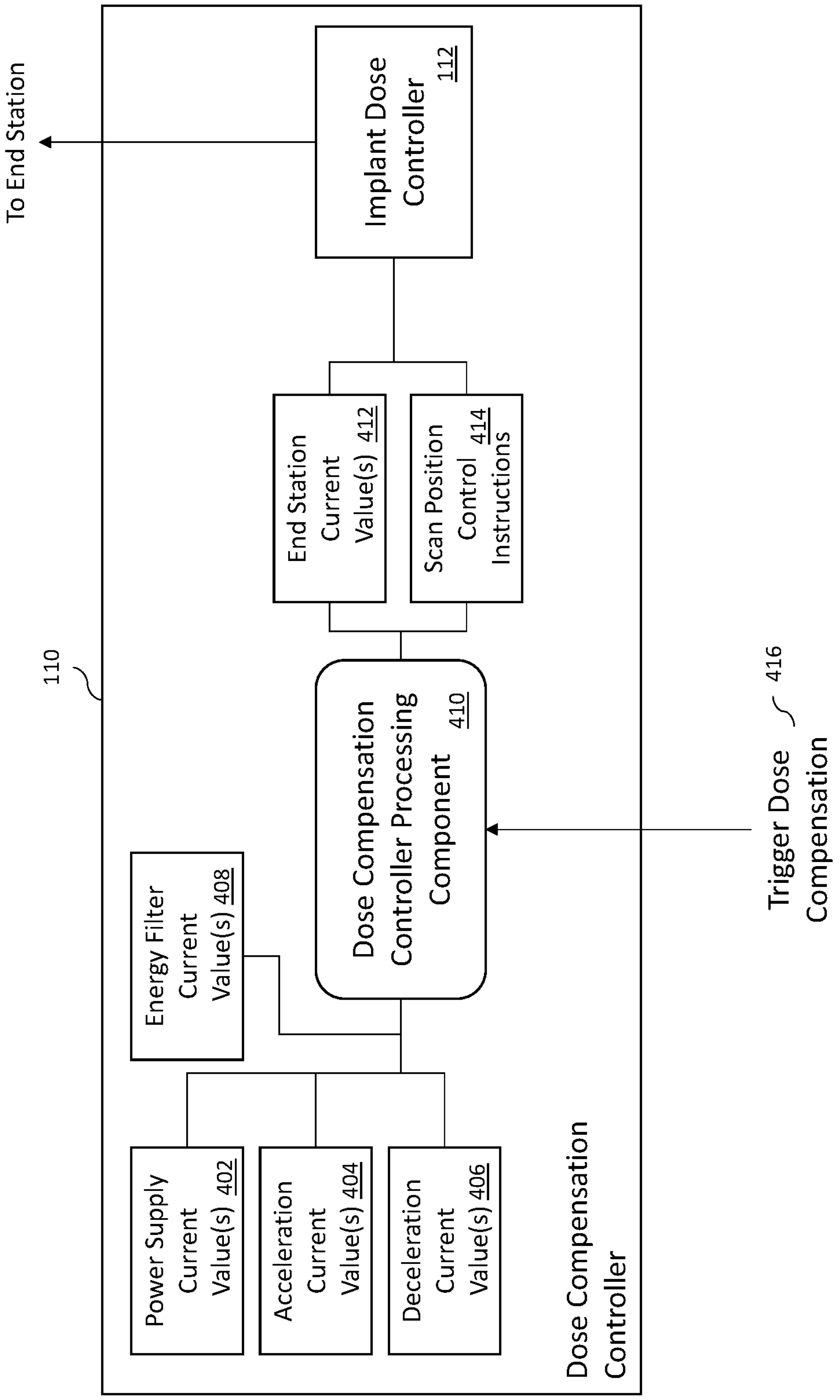
FIG. 4 illustrates an example of the beamline current measurement component, according to some implementations of the current subject matter.
Figure 5:
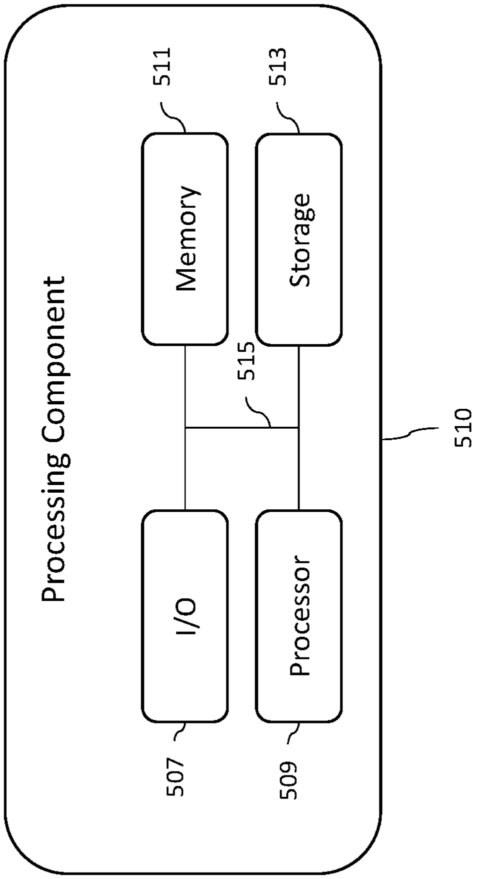
FIG. 5 illustrates an example of the beamline current measurement processing component, according to some implementations of the current subject matter.

Further, upon receiving an indication from the energy mode controller 108, the filter current measurement component 130 of the dose compensation controller 110 may initiate collection of data/information related to current values determined based on potential(s) supplied by one or more filter power suppl(ies) 128 to one or more electrode(s) 127. The filter current measurement component 130 may receive the current values automatically and/or upon being requested by the dose compensation controller 110. In some implementations, the filter current measurement component 130 may be configured to provide individual current values to a processing component the dose compensation controller 110 (as shown in FIGS. 4-5) and/or a sum of all current values that it receives from filter power supplies 128 and/or sums of current values per each electrode 127 that it receives from each specific power supply 128.

As can be understood, the above current values may be provided to the dose compensation controller 110 in a particular format (e.g., uniform format) and/or any other desired format. The processing component of the dose compensation controller 110 may be configured to convert the data/information that it receives from power supplies 118, 124 and/or 126 into a format suitable for the computations of platen velocity, position, and/or orientation executed by the processing component of the dose compensation controller 110.

The dose compensation controller 110 may be configured to use current values that it receives from other components of the system 100 to determine one or more velocities, positions and/or orientations of the platen 134. These value(s) may be determined using Equations (4)-(5). In some implementations, the velocities, positions and/or orientations of the platen 134 may be continuously updated in real-time upon receiving of updated current values from one or more components of the system 100. This may allow real-time adjustments of the velocities, positions and/or orientations of the platen 134, which, in turn, may ensure uniform application of the ion beam 140 to the substrate 136.

The determine velocities, positions and/or orientations of the platen 134 may be provided by the processing component of the dose compensation controller 110 to the implant dose controller 112. The implant dose controller 112 may send instructions, via connection 141, to the platen adjustment mechanisms 132 (e.g., one or more motors) to trigger adjustments of the velocities, positions and/or orientations of the platen 134 in accordance with the platen velocities, positions and/or orientations values determined by the dose compensation controller 110.

Figure 2:
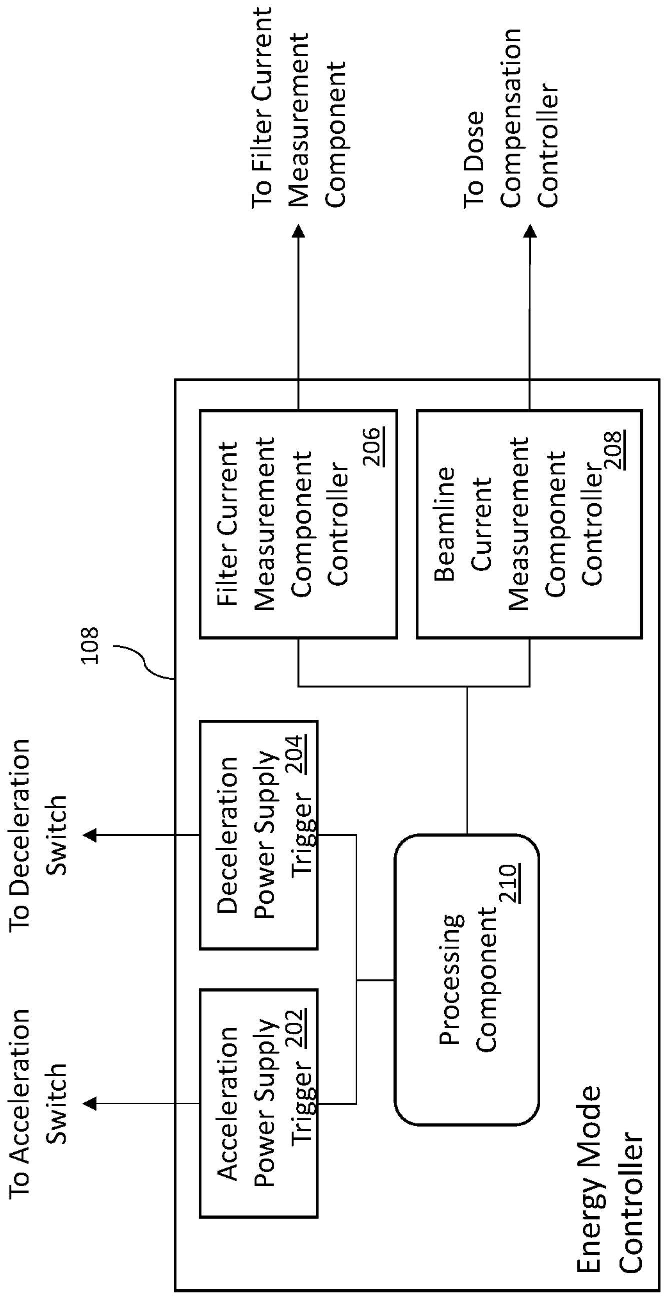
FIG. 2 illustrates an example of the energy mode control component, according to some implementations of the current subject matter.

FIG. 2 illustrates an example of the energy mode controller 108, according to some implementations of the current subject matter. As discussed herein, the energy mode controller 108 may be configured to control operational modes of the system 100, which may include an accelerating mode, a decelerating mode, and/or no accelerating or decelerating mode.

The energy mode controller 108 may include an acceleration power supply trigger 202, a deceleration power supply trigger 204, a filter current measurement component controller 206, a beamline current measurement component controller 208, and a processing component 210. The acceleration power supply trigger 202 and the deceleration power supply trigger 204 may be communicatively coupled to the processing component 210. The acceleration power supply trigger 202 may also be communicatively coupled to the switch 120 (not shown in FIG. 2). The deceleration power supply trigger 204 may be communicatively coupled to the switch 122 (not shown in FIG. 2). The processing component 210 may be communicatively coupled to controllers 206 and 208. Moreover, the switch **122*a* may also be controlled by the energy mode controller 108 to enable application of potential from the ion source power supply 118 in the accelerating mode (opening the switch 122*a*) and connecting the ion source power supply 118 to ground in the decelerating mode (closing the switch 122*a***).

Upon receiving one or more inputs associated with operation of the system 100 (e.g., whether the system 100 is to operate in an accelerating mode, a decelerating mode, and/or no accelerating or decelerating current mode), the processing component 210 may send instructions to the acceleration power supply trigger 202 and/or deceleration power supply trigger 204 to close and/or open one or more switches 120, 122 (and/or to keep the switches open/closed). For example, an input indicating that the system 100 is to operate in the accelerating mode may cause the processing component 210 to send instructions to the acceleration power supply trigger 202 to close the switch 120 so that accelerating power supply 124 may be communicatively coupled to the beamline component 102 (not shown in FIG. 2), and to open (or keep open) the switch 124 so that the decelerating power supply 126 is not coupled to the beamline component 102. Alternatively, an input indicating that the system 100 is to operate in the decelerating mode may cause the processing component 210 to send instructions to the deceleration power supply trigger 204 to close the switch 122 so that decelerating power supply 126 may be communicatively coupled to the beamline component 102 (not shown in FIG. 2), and to open (or keep open) the switch 122 so that the accelerating power supply 124 is not coupled to the beamline component 102. In some example implementations, an input indicating that neither of the accelerating or decelerating power supplies are to be coupled to the beamline component 102 (as well as whether or not the ion source power supply 118 is to be coupled to the ground) may cause the processing component 210 to send instructions to open (or keep open) both switches 120 and 122, thereby preventing coupling of both power supplies 124, 126 to the beamline component 102.

In some implementations, the inputs may be automatically provided and/or determined by the system 100 (e.g., using processing component 210 and/or dose compensation controller 110) based on one or more characteristics associated with end product result, e.g., final form of the substrate, that may be desired. The inputs may also be manually provided to the energy mode controller 108. As can be understood, any desired way of indicating operational mode of the system 100 may be provided.

The processing component 210 may also send instructions to the filter current measurement component controller 206, which may, in turn, send instructions to the filter current measurement component 130 of the dose compensation controller 110 to enable determination of filter currents based on potentials that may be supplied by the filter power supplies 128 (not shown in FIG. 2). In some example implementations, the instructions from the processing component 210, via the filter current measurement component controller 206, may indicate that filter current is to be measured from one of the power supplies 128 (e.g., power supply 128*a*) but not the other (e.g., power supply 128*b*). Moreover, the instructions may also be indicative of how measurements are to be obtained, e.g., on periodic basis (for example, at certain times during operation of the system 100), continuously, at certain intervals, and/or using any other schedule. As can be understood, any other type of instructions associated with filter current measurement may be sent from the filter current measurement component controller 206 to the filter current measurement component 130 (not shown in FIG. 2).

The processing component 210 may also send instructions to the beamline current measurement component controller 208, which may, in turn, send instructions to the dose compensation controller 110 (not shown in FIG. 2) to enable the dose compensation controller 110 to initiate dose compensation process. During this process, the dose compensation controller 110 may gather data/information related to current measurements (e.g., from power supplies 118, 124/126, filter power supplies 128 (via the filter current measurement component 130)) and determine positioning of the platen 134 in the end station 106, which may include one or more parameters related to translation, rotation, tilting, etc. of the platen 134 (not shown in FIG. 2). In some implementations, the beamline current measurement component controller 208 may receive one or more communications from the dose compensation controller 110. The communications may be sent to the beamline current measurement component controller 208 in response to controller 110 receiving one or more current values from one or more power supplies 118, 124/126, filter power supplies 128, etc., and may query the beamline current measurement component controller 208 whether the dose compensation controller 110 should initiate the dose compensation process. Alternatively, or in addition, the dose compensation controller 110 may send a communication to the beamline current measurement component controller 208 indicating that it initiated dose compensation process as result of receiving one or more current values and/or in response to one or more inputs provided to the system 100. In the latter case, in response to the input(s), the dose compensation controller 110 may instruct, via the beamline current measurement component controller 208, the energy mode controller 108 to activate one or more operational modes (e.g., accelerating, decelerating, and/or none).

Figure 3:
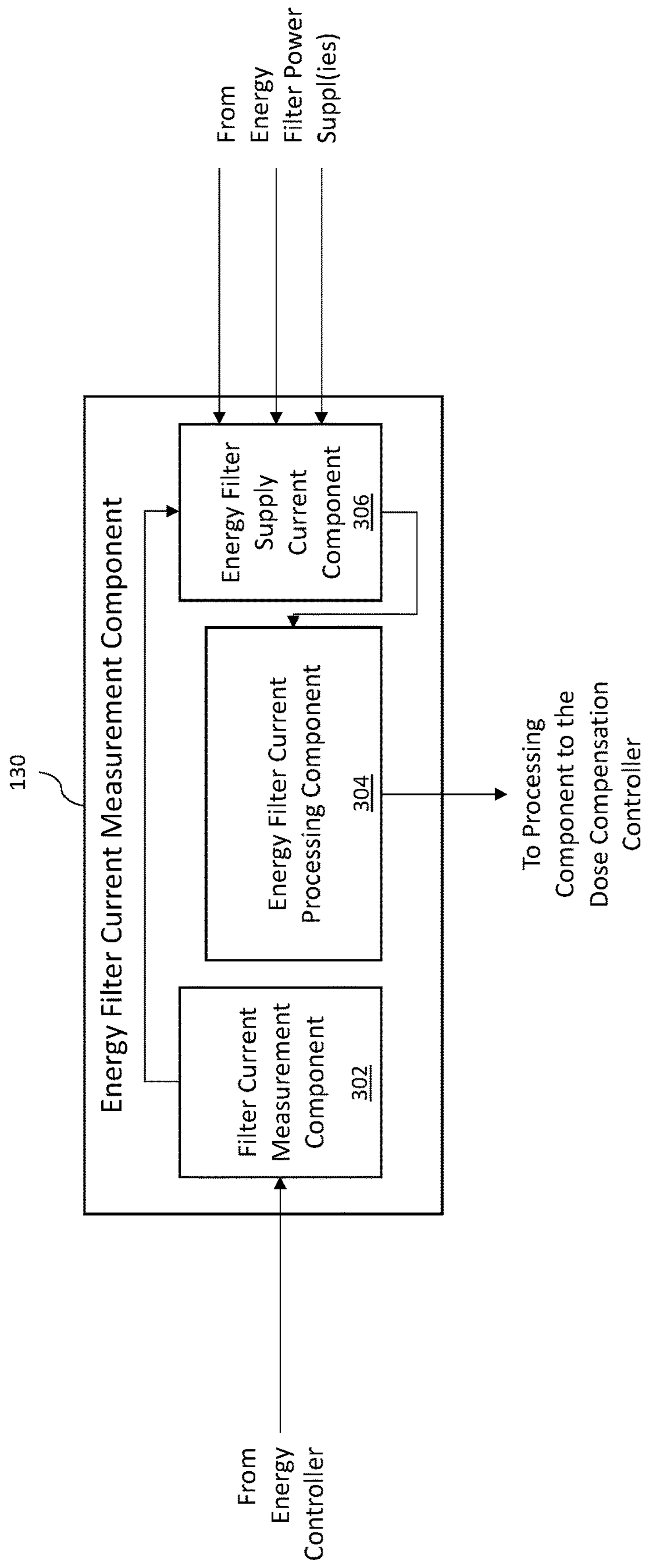
FIG. 3 illustrates an example of the energy filter current measurement component, according to some implementations of the current subject matter.

FIG. 3 illustrates an example of the energy filter current measurement component 130, according to some implementations of the current subject matter. As discussed herein, the energy filter current measurement component 130 may be configured to obtain filter power supply current values that may be provided by the filter power suppl(ies) 128 to one or more electrodes 127 disposed in the energy filter 104 (not shown in FIG. 3).

The filter current measurement component 130 may include a filter current measurement component 302, an energy filter current processing component 304, and an energy filter supply current component 306. The filter current measurement component 302 may be communicatively coupled to the energy mode controller 108, and in particular, its filter current measurement component controller 206 (not shown in FIG. 3). It may also be communicatively coupled to the energy filter supply current component 306, which may, in turn, be communicatively coupled to the filter power suppl(ies) 128. The energy filter supply current component 306 may be communicatively coupled to the energy filter current processing component 304, which may, in turn, be communicatively coupled to the processing component of the dose compensation controller 110 (not shown in FIG. 3).

The filter current measurement component 302 may be configured to receive instructions from the filter current measurement component controller 206 to enable the filter current measurement component 130 to begin obtaining data/information related to currents determined based on potentials being supplied by one or more filter power supplies 128 to one or more electrodes 127. The instructions may indicate how the data/information should be obtained, e.g., periodically, continuously, at certain intervals, etc. As discussed herein, the instructions may also indicate whether power supply currents should be obtained from certain power supplies 128 but not from others.

Upon receiving instructions from the filter current measurement component controller 206 of the energy mode controller 108, the filter current measurement component 302 may trigger energy filter supply current component 306 to begin obtaining and/or receiving data/information related to currents determined based on potentials being supplied by the filter power suppl(ies) 128. The data/information collected by the energy filter supply current component 306 may be sent to the energy filter current processing component 304. The energy filter current processing component 304 may process the current values data/information and provide it to the dose compensation controller 110 (not shown in FIG. 3) for further processing.

FIG. 4 illustrates an example of the dose compensation controller 110, according to some implementations of the current subject matter. The dose compensation controller 110 may be configured to obtain current values from power supplies 118, 124, and/or 126, as well as filter power suppl(ies) 128 and determine specific positioning of the platen 134 in the end station 106 (not shown in FIG. 4) using, for example, Equation (1).

The dose compensation controller 110 may include a dose compensation controller processing component 410 that may be configured to receive one or more power supply current value(s) 402, one or more acceleration current value(s) 404, one or more deceleration current value(s) 406, and/or one or more energy filter current value(s) 408. Using one or more of these current value(s), the dose compensation controller processing component 410 may generate one or more end station current value(s) 412. and/or one or more scan position control instruction(s) 414 (e.g., velocity, position and/or orientation value(s)) as part of the dose compensation process. As discussed herein, the current value(s) may be determined based on values of potentials applied by respective power supplies. The current value(s) 412 and/or scan position control instruction(s) 414 may be provided to the implant dose controller 112, which may use this information to adjust velocities, positions and/or orientations of the platen 134 in the path of the ion beam 140 in the end station 106 (not shown in FIG. 4). Adjustment of velocities, positions and/or orientations of the platen 134 in the path of the ion beam 140 may ensure that the ion beam dose(s) is/are uniformly and/or evenly applied to the substrate 136 positioned on the platen 134. This is in contrast to conventional systems that lack an ability to track how ion beam is being applied to the substrate and suffer from photoresist outgassing, which result in non-uniform application of ion beam to the substrate.

The dose compensation process may, for example, be initiated upon receiving a trigger dose compensation instruction 416 from the energy mode controller 108, and in particular, its beamline current measurement component controller 208. Alternatively, or in addition, the dose compensation controller processing component 410 may be configured to initiate execution of the dose compensation process upon receiving one or more current value(s) 402-408. Moreover, the dose compensation controller processing component 410 may continuously execute the dose compensation process to generate updated velocities, positions and/or orientations data for the platen 134 and/or updated end station current values. The dose compensation controller processing component 410 may also query (e.g., periodically, continually, and/or at any desired intervals) the power supplies 118, 124, 126, and/or filter power supplies 128 and request updated data/information related to current values. This may allow the dose compensation controller processing component 410 to dynamically and/or in real-time update velocity, position and/or orientation data for the platen 134 and/or end station current values, further ensuring uniform application of the ion beam to the substrate 136.

Once positioning data is determined, the dose compensation controller processing component 410 may generate scan (e.g., velocity, position and/or orientation) control instruction(s) 414 and provide them to the implant dose controller 112, which may, in turn, trigger the platen adjustment mechanism(s) 132 to adjust velocities, positions and/or orientations of the platen 134 accordingly. The instructions 414 may be supplied to implant dose controller 112 as soon as they are determined by the dose compensation controller processing component 410 and may be on periodic, continuous, etc. basis. Similarly, the dose compensation controller processing component 410 may generate end station current value(s) 412 and provide them to the implant dose controller 112 to cause adjustments of currents being supplied by the system 100 during operation, which may, in turn, affect how the ion beam is directed at the substrate 136. This again may ensure more uniform application of the ion beam to the substrate. The value(s) 412 and instruction(s) 414 may be provided separately and/or together.

In some implementations, the dose compensation controller processing component 410 may be configured to include processing component 210 of the energy mode controller 108 and/or 304 of the energy filter current measurement component 130. Moreover, the dose compensation controller 110 may be configured to incorporate one or more of energy mode controller 108, filter current measurement component 130, implant dose controller 112 and/or may be configured to execute one or more functions performed by one or more of: energy mode controller 108, filter current measurement component 130, implant dose controller 112 in addition to the functions executed by the dose compensation controller 110.

FIG. 5 illustrates an example of the dose compensation controller's processing component 510, according to some implementations of the current subject matter. The processing component 510 may be similar to processing components 210, 304, 410 and/or any other processing component of the system 100 and may include an input/output (I/O) device 507, a processor 509, a memory 511, and a storage 513. Each of the components 507-513 may be interconnected using a system bus 515. The processor 509 may be configured to process instructions for execution within the processing component 510. In some implementations, the processor 509 may be a single-threaded processor. Alternatively, or in addition, the processor 509 may be a multi-threaded processor. The processor 509 may be further configured to process instructions stored in the memory 511 and/or in the storage 513, including, but not limited to, receiving and/or sending information through the I/O device 507. The memory 511 may store information within the processing component 510. In some implementations, the memory 511 may be a computer-readable medium. Alternatively, or in addition, the memory 511 may be a volatile memory unit. In yet some implementations, the memory 511 may be a non-volatile memory unit. The storage 513 may be capable of providing mass storage for the processing component 510. In some implementations, the storage device 513 may be a computer-readable medium. Alternatively, or in addition, the storage 513 may be a floppy disk device, a hard disk device, an optical disk device, a tape device, non-volatile solid-state memory, or any other type of storage device. The I/O device 507 may provide input/output operations for the processing component 510. In some implementations, the I/O device 507 may include a keyboard and/or pointing device. Alternatively, or in addition, the I/O device 507 may include a display unit for displaying graphical user interfaces.

In some example implementations, one or more components of the processing component 510 (and/or system 100) may include any combination of hardware and/or software. In some implementations, one or more components of the system 100 may be disposed on one or more computing devices, such as, server(s), database(s), personal computer (s), laptop(s), cellular telephone(s), smartphone(s), tablet computer(s), virtual reality devices, and/or any other computing devices and/or any combination thereof. In some example implementations, one or more components of the processing component 510 may be disposed on a single computing device and/or may be part of a single communications network. Alternatively, or in addition to, such services may be separately located from one another. A service may be a computing processor, a memory, a software functionality, a routine, a procedure, a call, and/or any combination thereof that may be configured to execute a particular function associated with the current subject matter lifecycle orchestration service(s).

In some implementations, the processing component 510's one or more components may include network-enabled computers. As referred to herein, a network-enabled computer may include, but is not limited to a computer device, or communications device including, e.g., a server, a network appliance, a personal computer, a workstation, a phone, a smartphone, a handheld PC, a personal digital assistant, a thin client, a fat client, an Internet browser, or other device. One or more components of the system 100 also may be mobile computing devices, for example, an iPhone, iPod, iPad from Apple® and/or any other suitable device running Apple's iOS® operating system, any device running Microsoft's Windows®. Mobile operating system, any device running Google's Android® operating system, and/or any other suitable mobile computing device, such as a smartphone, a tablet, or like wearable mobile device.

One or more components of the processing component 510 may include a processor and a memory, and it is understood that the processing circuitry may contain additional components, including processors, memories, error and parity/CRC checkers, data encoders, anti-collision algorithms, controllers, command decoders, security primitives and tamper-proofing hardware, as necessary to perform the functions described herein. One or more components of the processing component 510 may further include one or more displays and/or one or more input devices. The displays may be any type of devices for presenting visual information such as a computer monitor, a flat panel display, and a mobile device screen, including liquid crystal displays, light-emitting diode displays, plasma panels, cathode ray tube displays, or other. The input devices may include any device for entering information into the user's device that is available and supported by the user's device, such as a touchscreen, keyboard, mouse, cursor-control device, touchscreen, microphone, digital camera, video recorder or camcorder. These devices may be used to enter information and interact with the software and other devices described herein.

In some example implementations, one or more components of the processing component 510 may execute one or more applications, such as software applications, that enable, for example, network communications with one or more components of processing component 510 and transmit and/or receive data.

One or more components of the processing component 510 may include and/or be in communication with one or more servers via one or more networks and may operate as a respective front-end to back-end pair with one or more servers. One or more components of the processing component 510 may transmit, for example, from a mobile device application (e.g., executing on one or more user devices, components, etc.), one or more requests to one or more servers. The requests may be associated with retrieving data from servers. The servers may receive the requests from the components of the processing component 510. Based on the requests, servers may be configured to retrieve the requested data from one or more databases. Based on receipt of the requested data from the databases, the servers may be configured to transmit the received data to one or more components of the processing component 510, where the received data may be responsive to one or more requests.

The processing component 510 may include and/or be communicatively coupled to one or more networks. In some implementations, networks may be one or more of a wireless network, a wired network or any combination of wireless network and wired network and may be configured to connect the components of the processing component 510 and/or the components of the processing component 510 to one or more servers. For example, the networks may include one or more of a fiber optics network, a passive optical network, a cable network, an Internet network, a satellite network, a wireless local area network (LAN), a metropolitan area network (MAN), a wide area network (WAN), a virtual local area network (VLAN), an extranet, an intranet, a Global System for Mobile Communication, a Personal Communication Service, a Personal Area Network, Wireless Application Protocol, Multimedia Messaging Service, Enhanced Messaging Service, Short Message Service, Time Division Multiplexing based systems, Code Division Multiple Access based systems, D-AMPS, Wi-Fi, Fixed Wireless Data, IEEE 802.11b, 802.15.1, 802.11n and 802.11g, Bluetooth, NFC, Radio Frequency Identification (RFID), Wi-Fi, and/or any other type of network and/or any combination thereof.

In addition, the networks may include, without limitation, telephone lines, fiber optics, IEEE Ethernet 802.3, a wide area network, a wireless personal area network, a LAN, or a global network such as the Internet. Further, the networks may support an Internet network, a wireless communication network, a cellular network, or the like, or any combination thereof. The networks may further include one network, or any number of the exemplary types of networks mentioned above, operating as a stand-alone network or in cooperation with each other. The networks may utilize one or more protocols of one or more network elements to which they are communicatively coupled. The networks may translate to or from other protocols to one or more protocols of network devices. The networks may include a plurality of interconnected networks, such as, for example, the Internet, a service provider's network, a cable television network, corporate networks, and home networks.

The processing component 510 may include and/or be communicatively coupled to one or more servers, which may include one or more processors that maybe coupled to memory. Servers may be configured as a central system, server or platform to control and call various data at different times to execute a plurality of workflow actions. Servers may be configured to connect to the one or more databases. Servers may be incorporated into and/or communicatively coupled to at least one of the components of the processing component 510.

Figure 6:
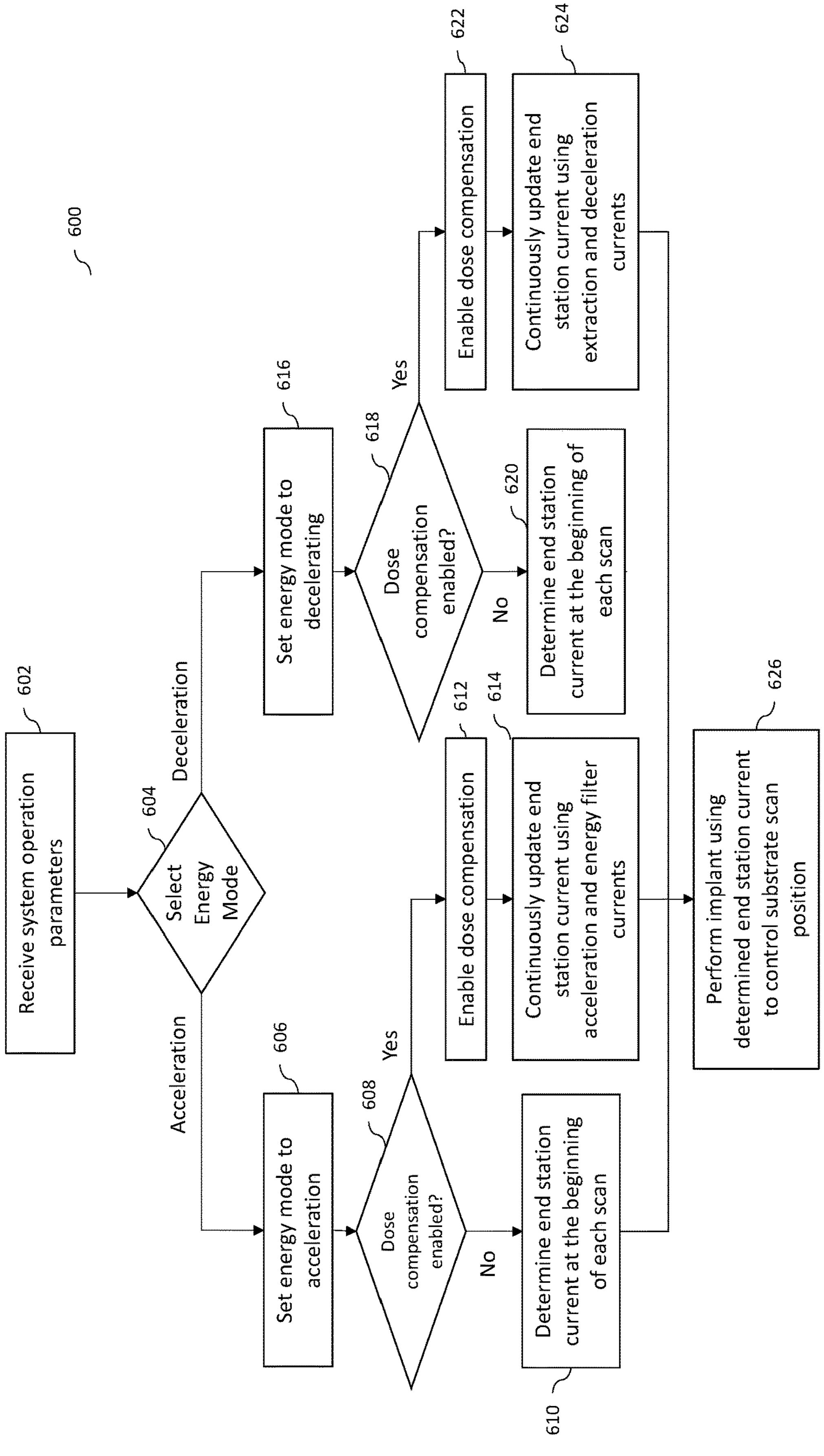
FIG. 6 illustrates an example process, according to some implementations of the current subject matter.

FIG. 6 illustrates an example dose compensation process 600, according to some implementations of the current subject matter. The process 600 may be executed by one or more components of the system 100 shown in FIG. 1.

At 602, one or more system operation parameters or inputs may be received by the system 100. For example, the inputs may be received using one or more input components (e.g., a graphical user interface that may be communicatively coupled to the processing component 510). The inputs may include specific energy level(s) using which an ion beam will be generated (and/or altered) for implantation application to the substrate (e.g., substrate 136 as shown in FIG. 1). Moreover, the inputs may include an indication whether dose compensation process will be enabled (e.g., determination of velocity, position, and/or orientation value(s) for the platen in the path of the ion beam). Moreover, a value of dose compensation factor K (as in equation (4)) may be received. As can be understood, any value of dose compensation factor may be used and may depend on a specific end product that may be desired.

Once the system operation parameters are received, the energy mode controller 108 may determine whether a specific operation mode (e.g., acceleration or deceleration mode) has been selected, at 604. If acceleration mode is enabled, the energy mode controller 108 may send instructions to switch 120 so that acceleration power supply 124 (and/or power supply 118) may initiate a supply of current to the beamline component 102. Moreover, the energy mode controller 108 (and/or the dose compensation controller 110) may determine whether dose compensation process has been enabled, at 608. If not, the dose compensation controller 110 may determine end station current(s) ($I_{ES0}$) at the beginning of each scan by the ion beam 140 of the substrate 136 in the end station 106, at 610. The system 100 may then perform ion implantation on the substrate 136 using end station current while controlling substrate scan position(s), at 626.

If the dose compensation process has been enabled (as determined by the energy mode controller 108 and/or dose compensation controller 110), at 608, the energy mode controller 108 and/or the dose compensation controller 110 may enable and/or initiate dose compensation process (as discussed herein), at 612. The dose compensation controller 110 may then continuously update end station currents using acceleration currents ($I_{ACC}$) and energy filter current(s) ($I_{FILT}$), at 614, and subsequently, perform ion implantation on the substrate 136 using end station current while controlling substrate scan position(s), at 626.

If, at 604, a deceleration mode has been enabled, the energy mode controller 108 may send instructions to switch 122 to close (and to open switch 120) so that power supply 126 may provide power to the beamline component 102, at 616. At 618, the energy mode controller 108 (and/or the dose compensation controller 110) may determine whether dose compensation process has been enabled. If not, the dose compensation controller 110 may determine end station current(s) ($I_{ES0}$) at the beginning of each scan by the ion beam 140 of the substrate 136 in the end station 106, at 620. Ion implantation on the substrate 136 may then be performed using determined end station current while controlling substrate scan position(s), at 626.

If the dose compensation process has been enabled, at 618, the energy mode controller 108 and/or the dose compensation controller 110 may enable and/or initiate dose compensation process (as discussed herein), at 622. The dose compensation controller 110 may continuously update end station currents using deceleration currents ($I_{DEC}$) and energy filter current(s) ($I_{FILT}$), at 624, and subsequently, perform ion implantation on the substrate 136 using end station current while controlling substrate scan position(s), at 626.

Figure 7:
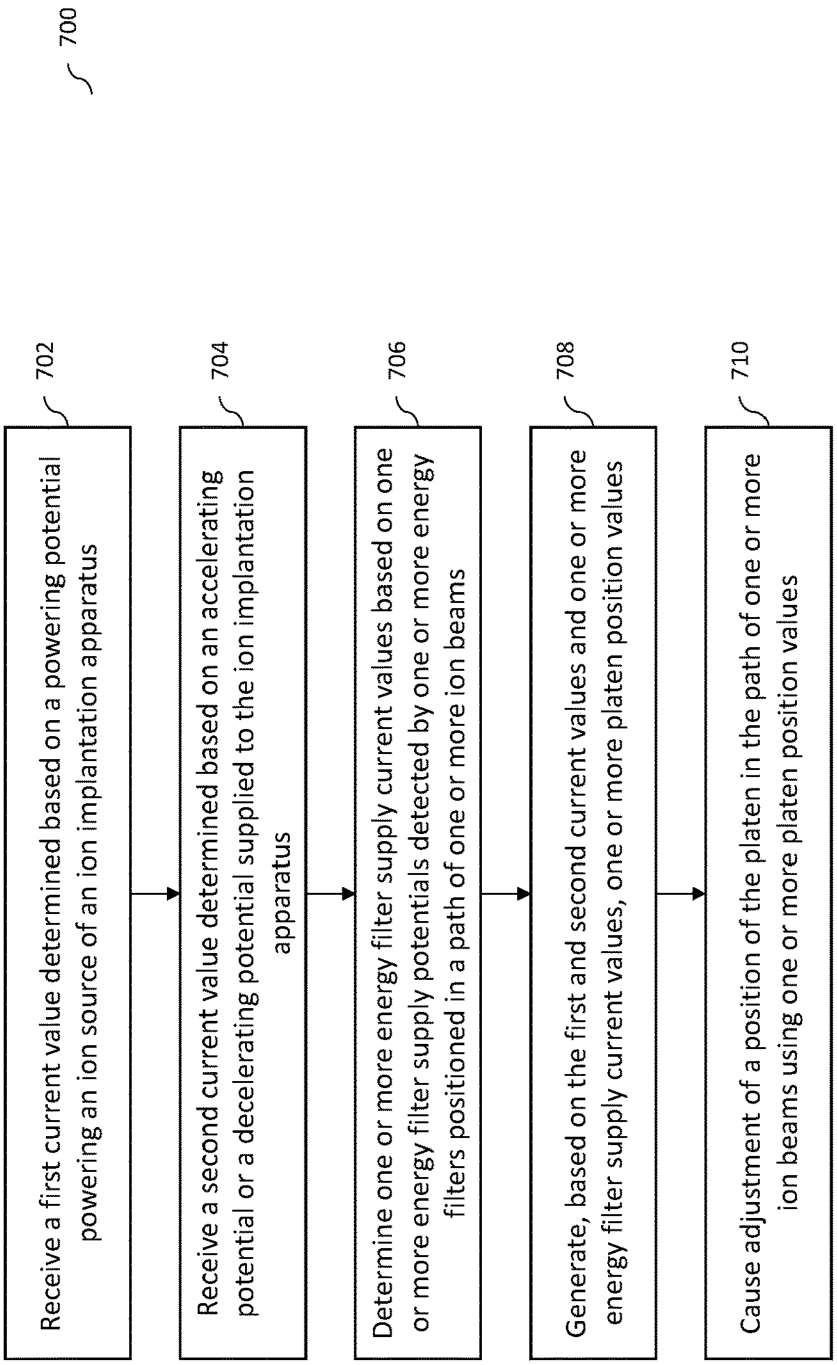
FIG. 7 illustrates an example dose compensation process, according to some implementations of the current subject matter.

FIG. 7 illustrates an example dose compensation process 700, according to some implementations of the current subject matter. The process 700 may be executed by one or more components of the system 100 shown in FIG. 1, and in particular, its processing component 510.

At 702, the processing component 510 may be configured to receive a first current value (e.g., value 402) associated with a powering current (e.g., from power supply 118) powering an ion source (e.g., ion source 116) of an ion implantation apparatus (e.g., system 100. It may also receive a second current value (e.g., values 404, 406, respectively) associated with an accelerating potential (e.g., from power supply 124) or a decelerating potential (e.g., from power supply 126) supplied to the ion implantation apparatus, at 704. The accelerating and/or decelerating potentials may affect generation of one or more ion beams (e.g., ion beam 138) by the ion source for application to a substrate (e.g., substrate 136) positioned on a platen (e.g., platen 134).

Supplying of accelerating and/or decelerating potentials may be controlled using the energy mode controller 108 via respective switches 120 and 122. The accelerating potentials may be configured to increase power of the ion beam(s). Conversely, the decelerating potentials may be configured to decrease power of the ion beam(s). In some implementations, application of the decelerating potential may be disabled (e.g., by opening or keeping open switch 122) while application of the accelerating potential is enabled (e.g., by closing switch 120). Oppositely, application of the accelerating potential is disabled (e.g., by opening or keeping open switch 120) while application of the decelerating potential is enabled (e.g., by closing switch 122). In the latter case, the ion source power supply 118 may also be connected to the ground.

At 706, the processing component 510 may determine one or more energy filter supply current values (e.g., value(s) 408) associated with one or more energy filter supply potentials supplied (e.g., as supplied by filter power supplies 128) to one or more energy filters (e.g., filter(s) 102) positioned in a path of the ion beam(s).

The energy filter(s) may include one or more electrodes (e.g., electrode(s) 127) that may be configured to affect one or more parameters of the ion beam(s) passing through the energy filters. The parameters may include at least one of the following: a direction of ion beam(s), a power of ion beam(s), a focus of ion beam(s), a trajectory of ion beam(s), and/or any other parameters, and/or any combination thereof.

At 708, the processing component 510 may generate one or more platen position values (e.g., scan position control instructions 414) based on the first and second current values and one or more energy filter supply current values. For example, the processing component 510 may use Equation (1) to determine platen position value(s) based on a difference between a sum of the first and second current values and the one or more energy filter supply current values.

At 710, the processing component 510 may cause adjustment of a position of the platen in the path of the ion beam(s) using the platen position value(s). For example, this may be accomplished by sending instructions 414 to the implant dose controller 112, which may trigger platen mechanisms 132 to adjust position of the platen 134.

In some implementations, adjusting position of the platen based on the platen position value(s) may cause the ion beam(s) to apply to a predetermined location on the substrate. Alternatively, or in addition, determinations of the processing component 510 may also trigger one or more adjustments of one or more electrode parameters associated with one or more electrodes in the energy filter(s). The electrode parameters may include at least one of the following: one or more current values of one or more currents supplied to one or more electrodes, one or more position values associated with one or more positions of one or more electrodes in the energy filter, and any combination thereof.

The various elements of the components as previously described with reference to FIGS. 1-7 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an implementation is implemented using hardware elements and/or software elements may vary in accordance with any number of factors, such as desired computational rate, power levels, heat tolerances, dielectric materials used, processing cycle budget, input data rates, output data rates, memory resources, data bus speeds and other design or performance constraints, as desired for a given implementation.

One or more aspects of at least one implementation may be implemented by representative instructions stored on a machine-readable medium which represents various logic within the processor, which when read by a machine causes the machine to fabricate logic to perform the techniques described herein. Such representations, known as "IP cores", may be stored on a tangible, machine readable medium and supplied to various customers or manufacturing facilities to load into the fabrication machines that make the logic or processor. Some implementations may be implemented, for example, using a machine-readable medium or article which may store an instruction or a set of instructions that, if executed by a machine, may cause the machine to perform a method and/or operations in accordance with the implementations. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writable or rewritable media, digital or analog media, hard disk, floppy disk, Compact Disk Read Only Memory (CD-ROM), Compact Disk Recordable (CD-R), Compact Disk Rewritable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in implementations.

At least one computer-readable storage medium may include instructions that, when executed, cause a system to perform any of the computer-implemented methods described herein.

Some implementations may be described using the expression "one implementation" or "an implementation" along with their derivatives. These terms mean that a particular feature, structure, or characteristic described in connection with the implementation is included in at least one implementation. The appearances of the phrase "in one implementation" in various places in the specification are not necessarily all referring to the same implementation. Moreover, unless otherwise noted the features described above are recognized to be usable together in any combination. Thus, any features discussed separately may be employed in combination with each other unless it is noted that the features are incompatible with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single implementation for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separate implementation. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The foregoing description of example implementations has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner and may generally include any set of one or more limitations as variously disclosed or otherwise demonstrated herein.

What is claimed:

1. An ion implantation apparatus, comprising:

an ion source configured to generate an ion beam directed at a substrate positioned on a platen;

a first power supply source configured to generate a powering potential to power the ion source;

one or more second power supply sources configured to generate an accelerating potential or a decelerating potential, the accelerating potential or the decelerating potential is configured to affect generation of the ion beam by the ion source for application to the substrate;

an energy filter positioned in a path of the ion beam between the ion source and the substrate;

a dose compensation controller configured to continuously:

determine a first current value based on the powering potential powering the ion source, and a second current value based on the accelerating potential or the decelerating potential;

determine one or more energy filter supply current values based on one or more energy filter supply potentials supplied to the energy filter;

generate, based on the first and second current values and the one or more energy filter supply current values, one or more platen position values; and cause adjustment of a position of the platen in the path of the ion beam using the one or more platen position values.

2. The apparatus of claim 1, wherein the accelerating potential is configured to increase an energy of the ion beam;

the decelerating potential is configured to decrease an energy of the ion beam.

3. The apparatus of claim 1, wherein application of the decelerating potential is disabled while application of the accelerating potential is enabled; and application of the accelerating potential is disabled while application of the decelerating potential is enabled.

4. The apparatus of claim 1, wherein the energy filter includes one or more electrodes configured to affect one or more parameters of the ion beam passing through the energy filter.

5. The apparatus of claim 4, wherein the one or more parameters include at least one of the following: a direction of the ion beam, an energy of the ion beam, a focus of the ion beam, a trajectory of the ion beam, and any combination thereof.

6. The apparatus of claim 1, wherein the one or more platen position values are determined based on a difference between a sum of the first and second current values and the one or more energy filter supply current values.

7. The apparatus of claim 6, wherein adjusting of the position of the platen based on the one or more platen position values causes the ion beam to be applied to a predetermined location on the substrate.

8. The apparatus of claim 6, wherein the dose compensation controller includes a filter current measurement component configured to adjust one or more electrode parameters associated with one or more electrodes in the energy filter.

9. The apparatus of claim 8, wherein the one or more electrode parameters include at least one of the following: one or more current values determined based on one or more potentials supplied to the one or more electrodes, one or more position values associated with one or more positions of the one or more electrodes in the energy filter, and any combination thereof.

10. An ion implantation system, comprising:

an ion source configured to generate an ion beam directed at a substrate positioned on a platen;

a first power supply source configured to generate a powering potential to power the ion source, wherein a first current value is determined based on the powering potential;

one or more second power supply sources configured to generate one or more second potentials, the one or more second potentials are configured to affect generation of the ion beam by the ion source for application to the substrate, wherein a second current value is determined based on the one or more second potentials;

an energy filter positioned in a path of the ion beam between the ion source and the substrate;

at least one processor; and at least one non-transitory storage media storing instructions, that when executed by the at least one processor, cause the at least one processor to continuously:

determine one or more energy filter supply current values based on one or more energy filter supply potentials supplied to the energy filter;

generate, based on the first and second current values and the one or more energy filter supply current values, one or more platen position values; and cause adjustment of a position of the platen in the path of the ion beam using the one or more platen position values.

11. The system of claim 10, wherein the one or more second potentials include an accelerating potential or a decelerating potential;

the one or more second power supply sources are configured to generate the accelerating potential to increase an energy of the ion beam; and the decelerating potential to decrease an energy of the ion beam.

12. The system of claim 11, wherein the one or more second power supply sources are configured to at least one of:

disable application of the decelerating potential and enable application of the accelerating potential; and disable application of the accelerating potential and enable application of the decelerating potential.

13. The system of claim 10, wherein the energy filter includes one or more electrodes configured to affect one or more parameters of the ion beam passing through the energy filter.

14. The system of claim 13, wherein the one or more parameters include at least one of the following: a direction of the ion beam, an energy of the ion beam, a focus of the ion beam, a trajectory of the ion beam, and any combination thereof.

15. The system of claim 10, wherein the one or more platen position values are determined based on a difference between a sum of the first and second current values and the one or more energy filter supply current values.

16. The system of claim 15, wherein adjusting the position of the platen based on the one or more platen position values causes the ion beam to be applied to a predetermined location on the substrate.

17. The system of claim 15, wherein one or more electrode parameters are associated with one or more electrodes in the energy filter, the at least one processor is configured to trigger adjustment of the one or more electrode parameters.

18. The system of claim 17, wherein the one or more electrode parameters include at least one of the following: one or more current values determined based on one or more potentials supplied to the one or more electrodes, one or more position values associated with one or more positions of the one or more electrodes in the energy filter, and any combination thereof.

* * * * *